United States Patent
Oowada (10) Patent No.: US 9,964,670 B2
(45) Date of Patent: May 8, 2018

(54) INORGANIC OPTICAL ELEMENT HAVING A BIREFRINGENT FILM WITH A COLUMNAR STRUCTURE AND A PROTECTIVE FILM FORMED THEREON AND METHOD FOR MANUFACTURING SAME

(71) Applicant: DEXERIALS CORPORATION, Shinagawa-ku, Tokyo (JP)

(72) Inventor: Masahiro Oowada, Tokyo (JP)

(73) Assignee: DEXERIALS CORPORATION, Shinagawa-Ku, Tokyo (JP)

( * ) Notice: Subject to any disclaimer, the term of this patent is extended or adjusted under 35 U.S.C. 154(b) by 92 days.

(21) Appl. No.: 15/031,071

(22) PCT Filed: Oct. 17, 2014

(86) PCT No.: PCT/JP2014/077684
§ 371 (c)(1),
(2) Date: Apr. 21, 2016

(87) PCT Pub. No.: WO2015/060213
PCT Pub. Date: Apr. 30, 2015

(65) Prior Publication Data
US 2016/0266282 A1    Sep. 15, 2016

(30) Foreign Application Priority Data
Oct. 22, 2013    (JP) ................. 2013-219491

(51) Int. Cl.
*G02B 5/30*    (2006.01)
*G02B 1/18*    (2015.01)
(Continued)

(52) U.S. Cl.
CPC .............. *G02B 1/18* (2015.01); *C23C 16/402* (2013.01); *C23C 16/455* (2013.01); *G02B 1/14* (2015.01); *G02B 5/3083* (2013.01)

(58) Field of Classification Search
CPC ... G02B 1/08; G02B 1/14; G02B 5/30; G02B 5/3083; G02B 5/3091; G02B 27/28; G02B 27/286
(Continued)

(56) References Cited

U.S. PATENT DOCUMENTS

| 6,187,445 B1 | 2/2001 | Ito et al. | |
| 2005/0045799 A1* | 3/2005 | Deng | .......... G02B 5/3083 250/200 |

(Continued)

FOREIGN PATENT DOCUMENTS

| JP | 1-312507 A | 12/1989 |
| JP | 9-297214 A | 11/1997 |

(Continued)

OTHER PUBLICATIONS

International Search Report (PCT/ISA/210) dated Jan. 20, 2015, by the Japanese Patent Office as the International Searching Authority for International Application No. PCT/JP2014/077684.
(Continued)

*Primary Examiner* — Arnel C Lavarias
(74) *Attorney, Agent, or Firm* — Buchanan, Ingersoll & Rooney PC (57) ABSTRACT

An inorganic optical element, including: a birefringent film 12 having a columnar structure; and a protective film 13 formed on the birefringent film 12, wherein a component of the protective film 13 enters a gap of the birefringent film 12.

7 Claims, 8 Drawing Sheets

(51) Int. Cl.
*G02B 1/14* (2015.01)
*C23C 16/455* (2006.01)
*C23C 16/40* (2006.01)

(58) Field of Classification Search
USPC ............ 359/483.01, 489.01, 489.06, 489.07, 359/489.15; 362/19; 353/20
See application file for complete search history.

(56) References Cited

U.S. PATENT DOCUMENTS

| | | |
|---|---|---|
| 2009/0029112 A1 | 1/2009 | Otake |
| 2011/0273771 A1 | 11/2011 | Oigawa et al. |
| 2012/0293732 A1 | 11/2012 | Koike et al. |
| 2013/0177717 A1 | 7/2013 | Koike et al. |
| 2013/0286480 A1* | 10/2013 | Hirota .................. G02B 5/3083 359/492.01 |

FOREIGN PATENT DOCUMENTS

| | | |
|---|---|---|
| JP | 11-109129 A | 4/1999 |
| JP | 2000-047033 A | 2/2000 |
| JP | 2004-070131 A | 3/2004 |
| JP | 2009-031537 A | 2/2009 |
| JP | 2010-160504 A | 7/2010 |
| JP | 2010-186164 A | 8/2010 |
| JP | 2012-008363 A | 1/2012 |
| JP | 2012-103577 A | 5/2012 |
| JP | 2012-242449 A | 12/2012 |

OTHER PUBLICATIONS

Written Opinion (PCT/ISA/237) dated Jan. 20, 2015, by the Japanese Patent Office as the International Searching Authority for International Application No. PCT/JP2014/077684.
International Preliminary Report on Patentability (PCT/IPEA/409) dated Feb. 4, 2016 for International Application No. PCT/JP2014/077684.

* cited by examiner

CVD SiO$_2$
40.313nm x500,000

INORGANIC OPTICAL ELEMENT HAVING A BIREFRINGENT FILM WITH A COLUMNAR STRUCTURE AND A PROTECTIVE FILM FORMED THEREON AND METHOD FOR MANUFACTURING SAME

BACKGROUND OF THE INVENTION

Technical Field

The present invention relates to an inorganic optical element including a birefringent film having a columnar structure, and a method for producing the inorganic optical element.

Background Art

Although a birefringent film having a columnar structure which is formed by obliquely vapor-depositing inorganic particles on a substrate surface has conventionally been used, there is concern that a phase difference varies depending on an amount of moisture contained in a void in the birefringent film. Therefore, for example, in the technologies described in PTLs 1 and 2, a protective film is formed on an obliquely vapor-deposited film to hold occluded water. In the technology described in PTL 3, a silane coupling agent containing a highly hydrophobic fluoroalkyl group is used to dispose a surface modification layer on a birefringent film, to thereby inhibit moisture from being adsorbed due to its water repellency.

CITATION LIST

Patent Literature

PTL 1: Japanese Patent Application Laid-Open (JP-A) No. 2000-047033
PTL 2: JP-A No. 2012-008363
PTL 3: JP-A No. 2012-103577

SUMMARY OF INVENTION

Technical Problem

However, the protective film disposed on the birefringent layer has poor adhesion due to the presence of voids in the columnar structure, potentially leading to film flaking.

The present invention is proposed based on the aforementioned current situations in the art, and aims to provide an inorganic optical element including a protective film which is formed on a birefringent layer and which is excellent in adhesion and a method for producing the inorganic optical element.

Solution to Problem

In order to solve the aforementioned problems, an inorganic optical element according to the present invention includes:
a birefringent film having a columnar structure; and
a protective film formed on the birefringent film,
wherein a component of the protective film enters a gap in the columnar structure of the birefringent film.

A method for producing an inorganic optical element according to the present invention includes:
forming a protective film on a birefringent film having a columnar structure to allow a component of the protective film to enter a gap in the columnar structure.

Advantageous Effects of the Invention

The present invention can improve adhesion between the birefringent film and the protective film by allowing a component of the protective film to enter a void in the columnar structure of the birefringent film and attaching the component of the protective film to the birefringent film.

DESCRIPTION OF EMBODIMENTS

Embodiments of the present invention will now be described in detail in the following order with reference to drawings, hereinafter.
1. Inorganic optical element
2. Method for producing inorganic optical element
3. Examples

1. Inorganic Optical Element

An inorganic optical element according to the present invention includes a birefringent film having a columnar structure and a protective film formed on the birefringent film. A component of the protective film enters a gap in the columnar structure of the birefringent film. This allows the component of the protective film to attach to the birefringent film, leading to high adhesion between the birefringent film and the protective film.

Figure 1:
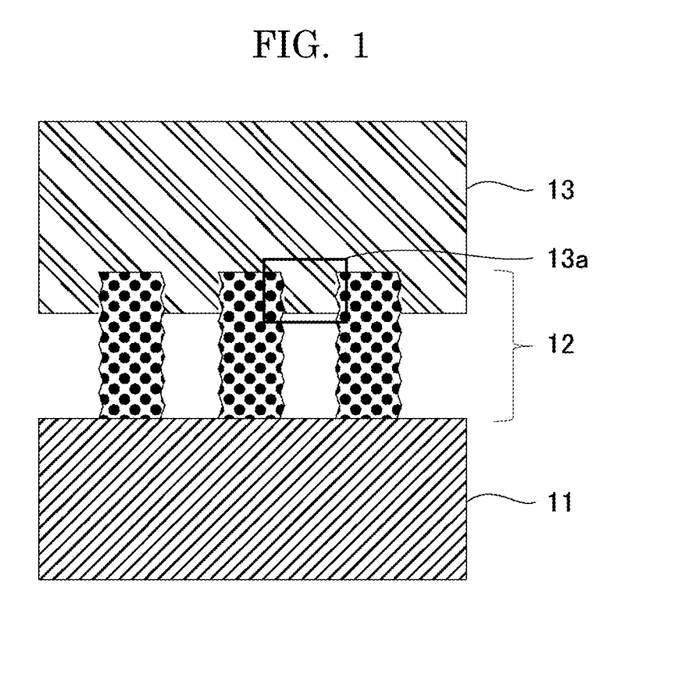
FIG. 1 is a schematic cross-sectional view partially illustrating an inorganic optical element according to the present invention.

FIG. 1 is a schematic cross-sectional view partially illustrating the inorganic optical element according to the present invention. As illustrated in FIG. 1, the inorganic optical element includes a base film 11, a birefringent film 12 formed on the base film 11, and a protective film 13 formed on the birefringent film 12.

The base film 11 is not particularly limited, and a multilayered film or a substrate may be used as appropriate.

The birefringent film 12 has a columnar structure which is composed of a bundle of columnar bodies made of, for example, a dielectric, a metal, or a semiconductor. One example of the birefringent film 12 having such a columnar structure includes an obliquely vapor-deposited film. The birefringent film 12 includes an entry a which is formed by allowing the component of the protective film 13 to enter the gap in the columnar structure. This can improve adhesion between the birefringent film 12 and the protective film 13.

The protective film 13 is made of an inorganic compound such as $SiO_2$, $Ta_2O_5$, $TiO_2$, $Al_2O_3$, $Nb_2O_5$, LaO, and $MgF_2$, and configured to prevent moisture from entering the birefringent film 12. This can prevent a phase difference from varying depending on an amount of moisture contained in a void in the birefringent film 12.

Examples of the inorganic optical element having the above described configuration include a wavelength plate which changes a polarization state of original light and a phase difference compensation polarizing plate which includes a birefringent film having a columnar structure. An inorganic wavelength plate will now be described as one example of the inorganic optical element.

Figure 2:
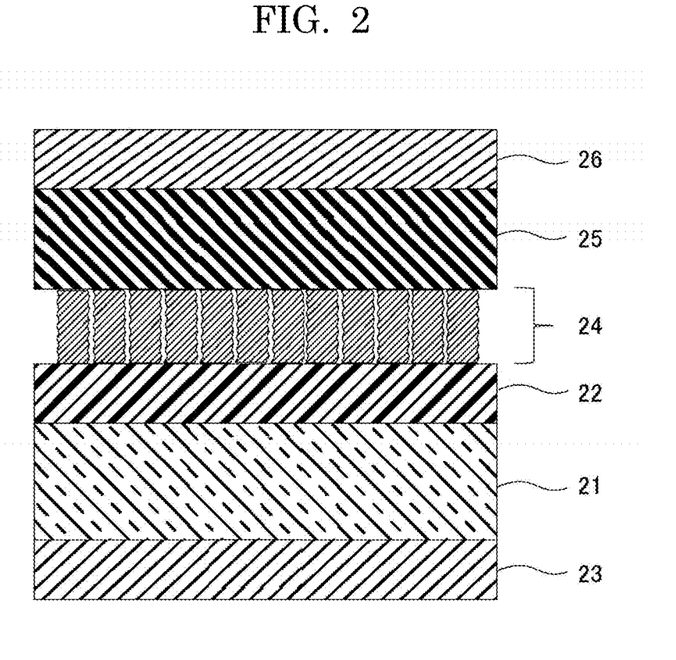
FIG. 2 is a cross-sectional view illustrating one exemplary configuration of an inorganic wavelength plate.

FIG. 2 is a cross-sectional view illustrating one exemplary configuration of the inorganic wavelength plate. As illustrated in FIG. 2, the inorganic wavelength plate includes a substrate 21, a matching film 22 formed on the substrate 21, a first AR film 23 formed on a surface of the substrate 21 opposite to the matching film 22, a birefringent film 24 formed on the matching film 22, a protective film 25 formed on the birefringent film 24, and a second AR film 26 formed on the protective film 25.

The substrate 21 is transparent to light in the wavelength band to be used, and is made of a material having a refractive index of 1.1 to 2.2 such as glass, sapphire, and crystal. Depending on an application of the wavelength plate, glass, in particular, quartz (refractive index: 1.46) or soda-lime glass (refractive index: 1.51) may be used. A component composition of the glass material is not particular limited. For example, an inexpensive glass material such as silicate glass, which is widely marketed as optical glass, may be used.

The matching film 22 is a multilayered film configured to prevent reflection at an interface between the birefringent film 24 and the substrate 21, and may be disposed as appropriate. The matching film 22 is, for example, a dielectric multilayered film, and is designed so as to invert phases of surface reflecting light and interface reflecting light and compensate with each other.

The first AR (Anti Reflection) film 23 may be, for example, a multilayered thin film including a high refractive film and a low refractive film which are commonly used. The first AR film 23 disposed on the substrate 21 can attenuate surface reflection and increase transmittance of the substrate 21.

The birefringent film 24 has a columnar structure which is composed of a bundle of columnar bodies made of one or more types of dielectrics. One example of the birefringent film 24 includes an obliquely vapor-deposited film which is formed by depositing inorganic particles of a dielectric through oblique vapor-deposition or oblique sputtering. The dielectric is preferably an oxide including one or more types selected from the group consisting of Ta, Si, Ti, Al, Mg, La, Zr, and Nb. Specific examples of the oxide include $Ta_2O_5$, $SiO_2$, $TiO_2$, $Al_2O_3$, MgO, $CeO_2$, $ZrO_2$, ZrO, and $Nb_2O_5$. Among them, $Ta_2O_5$, which is highly birefringent, is preferably used in the present embodiment.

The columnar structure includes a columnar portion which is formed by depositing dielectric particles and a void portion which is air space between the columnar portions. For example, the obliquely vapor-deposited film is formed utilizing the so-called self-shadowing effect. That is, when a dielectric material is obliquely vapor-deposited on a surface of the substrate, a shade portion on which the dielectric material cannot be deposited directly is created. This results in the columnar structure including the columnar portion which is formed by depositing dielectric particles and the void portion which is air space between the columnar portions.

An entry depth of the component of the protective film 25 into the columnar structure is preferably 3 nm or more, more preferably 10 nm or more. The more the entry depth of the component of the protective film 25 into the columnar structure is, the higher the adhesion between the protective film 25 and the birefringent film 24 is, leading to improved resistance to moisture. The entry depth of the component of the protective film 25 can be determined by TEM or an elemental analysis in the depth direction using ESCA analysis.

The protective film 25 is made of an inorganic compound such as $SiO_2$, $Ta_2O_5$, $TiO_2$, $Al_2O_3$, $Nb_2O_5$, LaO, and $MgF_2$, and configured to prevent moisture from entering the birefringent film 24. This can prevent the phase difference from varying depending on the amount of moisture contained in a void in the birefringent film 24.

The second AR film 26 may be, for example, a multilayered thin film including a high refractive film and a low refractive film which are commonly used, like the first AR film 23. The second AR film 26 disposed on the protective film 25 can attenuate surface reflection and increase transmittance of the protective film 25.

2. Method for Producing Inorganic Optical Element

Next, a method for producing an inorganic optical element according to the present invention will now be described. The method for producing an inorganic optical element according to the present invention includes forming a protective film on a birefringent film having a columnar structure to allow a component of the protective film to enter a gap in the columnar structure. This allows the component of the protective film to attach to the birefringent film, so that adhesion between the birefringent film and the protective film can be improved.

Figure 3:
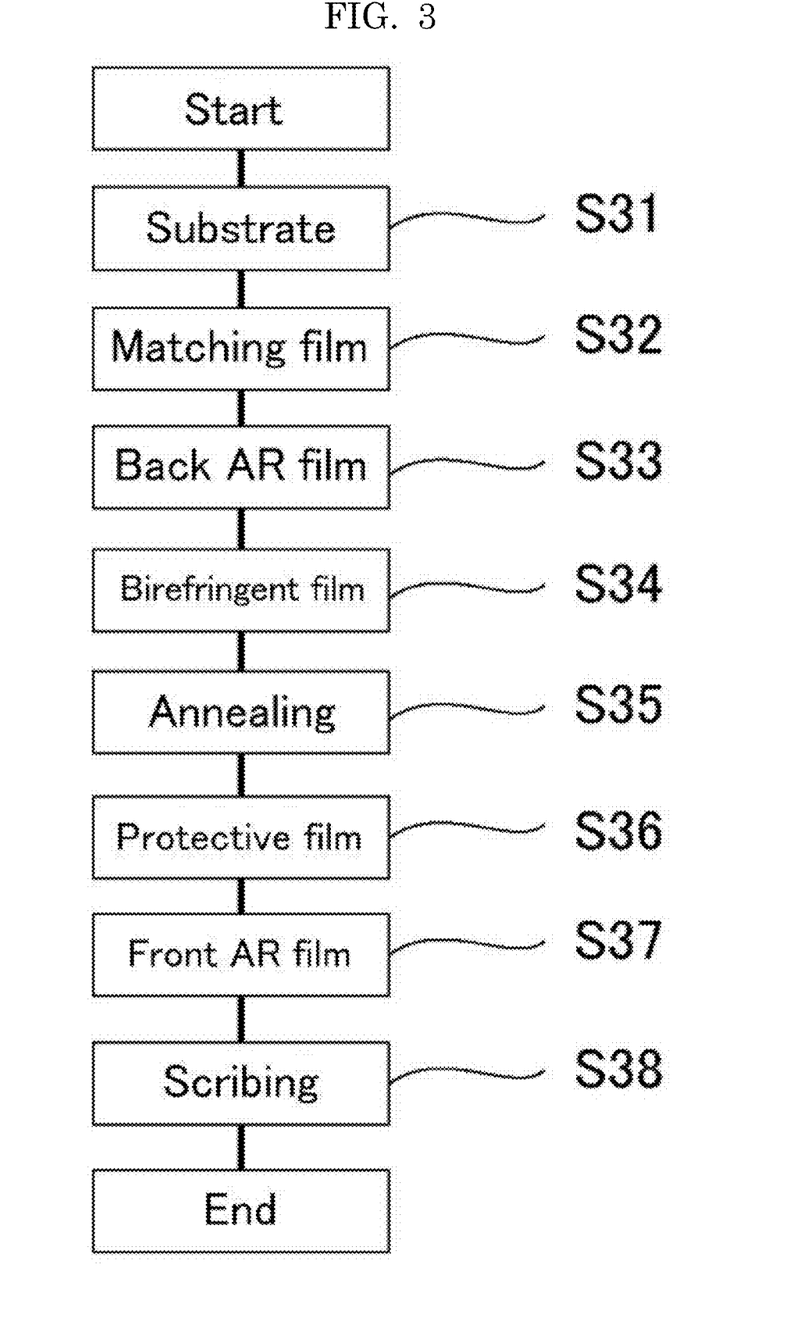
FIG. 3 is a flowchart illustrating one exemplary method for producing an inorganic wavelength plate.

A method for producing the inorganic wavelength plate having the configuration illustrated in FIG. 2 will now be described as a specific example of the inorganic optical element. FIG. 3 is a flowchart illustrating a method for producing the inorganic wavelength plate.

Firstly, at Step S31, the substrate 21 is prepared. Next, at Step S 32, the matching film 22, which is a multilayered film, is formed on the substrate 21 for the purpose of preventing reflection at the interface between the birefringent film 24 and the substrate 21. Then, at Step S33, the first AR film 23 is formed on a surface of the substrate 21 opposite to the matching film 22.

Then, at Step S34, the birefringent film 24 is formed on the matching film 22. The birefringent film 24 is formed through oblique vapor-deposition or oblique sputtering. For example, a bundle of columnar dielectrics may be formed as follows. A dielectric material is obliquely vapor-deposited on the substrate from one direction, the substrate is rotated 180°, and then the dielectric material is obliquely vapor-deposited from another direction. This vapor-deposition cycle is repeated a plurality of times.

Then, at Step S35, the birefringent film 24 is annealed at a temperature of 100° C. or higher but 300° C. or lower. This enables moisture contained in the gap portion in the birefringent film 24 to evaporate. Note that, when the birefringent film is annealed at an excessively high temperature, columnar bodies are grown to be a thicker columnar body, potentially leading to decreased birefringence or decreased transmittance.

Then, at Step S36, the protective film 25 is formed on the birefringent film 24. For example, in the case of depositing $SiO_2$ as the protective film 25, it is preferable to use TEOS (tetraethoxy silane) gas and $O_2$ as a $SiO_2$ material and a plasma CVD device.

Figure 4:
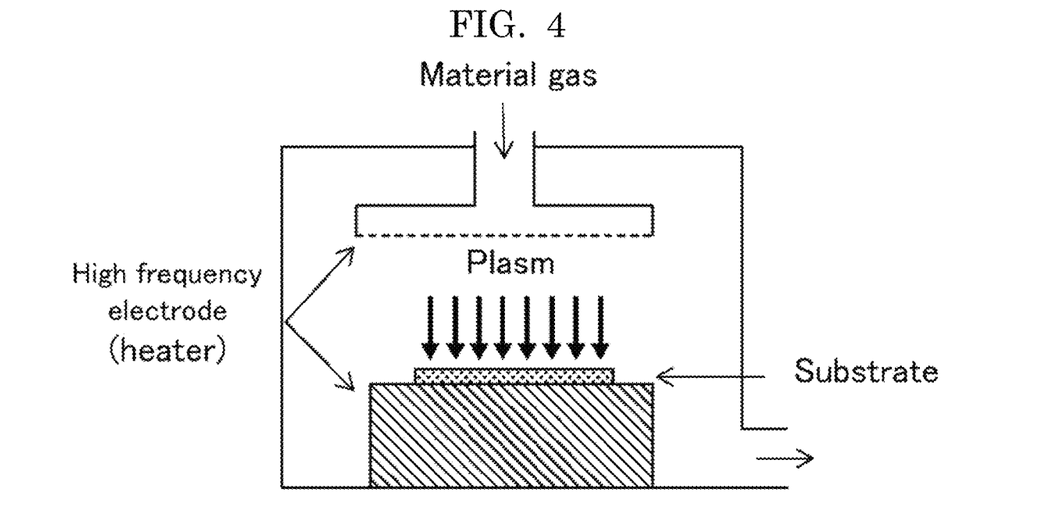
FIG. 4 is a schematic diagram illustrating a plasma CVD device.

FIG. 4 is a schematic diagram illustrating a plasma CVD (Chemical Vapor Deposition) device.

As illustrated in FIG. 4, the plasma CVD device is configured to excite the TEOS gas into plasma using a high frequency electrode, so that the TEOS gas can enter the void portion of the columnar structure relatively easily. The TEOS gas enter the void portion, where it binds to ionized $O_2$ to form $SiO_2$. A CVD process conditions is desirably adjusted as follows: flow ratio of TEOS gas to $O_2$:TEOS:$O_2$=1:3000 to 6000; film formation pressure: 60 Pa or higher; and film formation temperature: 150° C. or higher.

A $SiO_2$ protective film formed by the plasma CVD device is characterized by using a vaporized material gas unlike physical vapor deposition (e.g., sputtering). Therefore, the TEOS gas can enter the void portion of the columnar structure relatively easily. As a result, the whole surface of the birefringent film 24 can be sealed by adjusting film formation time.

Then, at Step S37, the second AR film 26 is formed on the protective film 25. At Step S38, the resultant is cut to size according to specifications by scribing, and subjected to inspection. Thus, the inorganic wavelength plate is completed.

Note that, a method for forming the protective film is not limited to the above described CVD method. The CVD method is superior in step coverage to a sputtering method or a vacuum vapor deposition method since a film is formed through a chemical reaction in a boundary layer including the void portion of the birefringent film. The effect of the present invention can be achieved by optimizing film formation conditions such as the film formation pressure and the flow ratio of gases depending on the CVD device to be used. The protective film can also be formed by an inorganic SOG (Spin on Glass) method or an ALD (Atomic Layer Deposition) method, which provides the same effect as the CVD method. Depending on use environment, the sputtering method or the vacuum vapor deposition method may also be used.

EXAMPLES

3. Example

Examples of the present invention will now be described. In Examples, inorganic wavelength plates in which a protective film is formed on a columnar structure were produced, and evaluated for adhesion of the protective film and for a rate of change of reflectivity during a high temperature and high humidity test. Note that, the present invention is not limited to Examples.

[Production of Wavelength Plate]

The inorganic wavelength plate illustrated in FIG. 2 was produced according to the flowchart illustrated in FIG. 3. Firstly, a matching film was formed on a glass substrate. Next, an anti-reflection film was formed on a surface of the glass substrate opposite to the matching film. Then, an obliquely vapor-deposited film made of $Ta_2O_5$ was formed on the matching film, and annealed at a temperature of 100° C. or higher but 300° C. or lower.

After annealing, a protective film made of $SiO_2$ was formed on the obliquely vapor-deposited film (birefringent film) using TEOS (tetraethoxy silane) gas and $O_2$ as a $SiO_2$ material and a plasma CVD device. Then, an anti-reflection film was laminated on the protective film, followed by cutting to size according to specifications by scribing. Thus, the inorganic wavelength plate was produced.

A CVD process condition for forming the protective film was adjusted as follows: flow ratio of TEOS gas to $O_2$:TEOS:$O_2$=1:3000 to 6000; film formation pressure: 60 Pa or higher; and film formation temperature: 150° C. or higher, to thereby produce inorganic wavelength plates with varying entry depths of $SiO_2$ into a void portion of the birefringent film.

The entry depth of a component of the protective film into the void portion of the birefringent film was determined as a difference between thicknesses of the protective film formed on the birefringent film and a protective film formed on a glass substrate when the glass substrate and a sample including the birefringent film were placed into the plasma CVD device and then protective films were formed thereon.

[Evaluation of Adhesion]

According to JIS K 5600, right-angled lattice pattern (25 squares) was cut from the anti-reflection film into the birefringent film. Then, a piece of tape was attached on the anti-reflection film and then peeled off. The protective film was evaluated for a flaking level, that is, resistance to peeling of the tape by classifying into Classifications 0 to 5 according to JIS K 5600.

Note that, classifications of the flaking level according to JIS K 5600 are as follows.

[Classification 0]; The edges of the cuts are completely smooth; none of the squares of the lattice is detached.

[Classification 1]; Detachment of small flakes of the coating at the intersections of the cuts. A cross-cut area not significantly greater than 5% is affected.

[Classification 2]; The coating has flaked along the edges and/or at the intersections of the cuts. A cross-cut area significantly greater than 5%, but not significantly greater than 15%, is affected.

[Classification 3]; The coating has flaked along the edges of the cuts partly or wholly in large ribbons, and/or it has flaked partly or wholly on different parts of the squares. A cross-cut area significantly greater than 15%, but not significantly greater than 35%, is affected.

[Classification 4]: The coating has flaked along the edges of the cuts in large ribbons and/or some squares have detached partly or wholly. A cross-cut area not significantly greater than 35% is affected.

[Classification 5]: Any degree of flaking that cannot even be classified by Classification 4.

A high temperature and high humidity test was performed at 60° C. and 90% RH for 500 hours to thereby evaluate for the presence or absence of film flaking on the inorganic wavelength plate after the test. The inorganic wavelength plate was evaluated as "Pass" in the case of the absence of the film flaking, and evaluated as "Fail" in the case of the presence of the film flaking.

Example and Comparative Example

The entry depth of the component of the protective film into the birefringent film in the inorganic wavelength plate of Comparative Example 1 was 0 nm. The entry depths of the components of the protective films into the birefringent films in the inorganic wavelength plates of Examples 1 to 4 were 3 nm, 5 nm, 10 nm, and 16 nm.

Table 1 represents the entry depth of the component of the protective film into the birefringent film, the flaking level, and the evaluation result for film flaking after the high temperature and high humidity test. The flaking level of the inorganic wavelength plate of Comparative Example 1 was Classification 5. The flaking levels of the inorganic wavelength plates of Examples 1 to 4 were Classification 3, Classification 2, Classification 0, and Classification 0. The film flaking after the high temperature and high humidity test of the inorganic wavelength plate of Comparative Example 1 was evaluated as Fail. The film flaking after the high temperature and high humidity test of the inorganic wavelength plates of Examples 1 to 4 were all evaluated as Pass.

TABLE 1

| | Entry depth of component of protective film [nm] | Flaking level (JIS K 5600) | Evaluation for film flaking after high temperature and high humidity test |
|---|---|---|---|
| Comp. Ex. 1 | 0 | Classification 5 | Fail |
| Ex. 1 | 3 | Classification 3 | Pass |
| Ex. 2 | 5 | Classification 2 | Pass |
| Ex. 3 | 10 | Classification 0 | Pass |
| Ex. 4 | 16 | Classification 0 | Pass |

Figure 5:
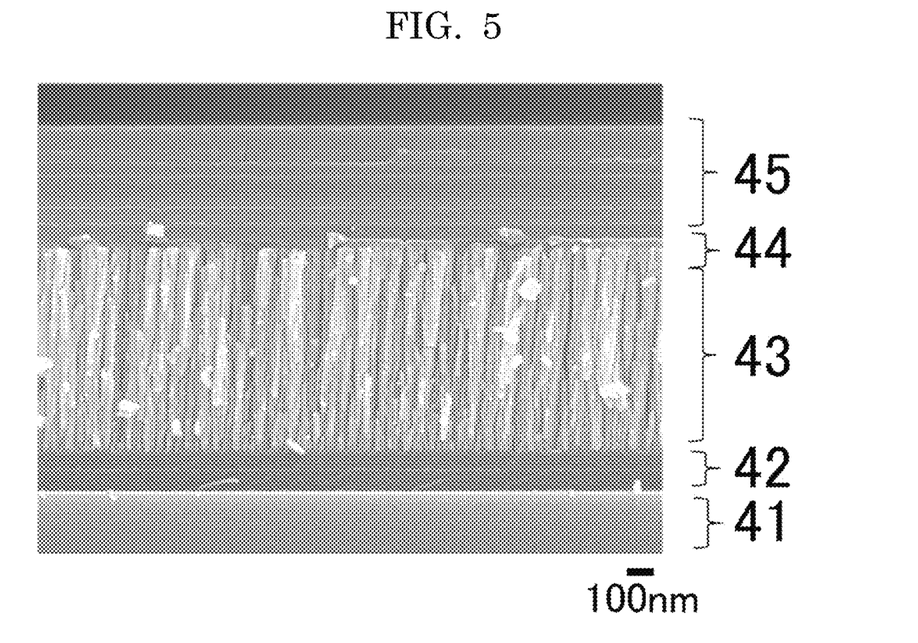
FIG. 5 is an SEM image illustrating a cross section of the inorganic wavelength plate of Comparative Example 1.
Figure 6:
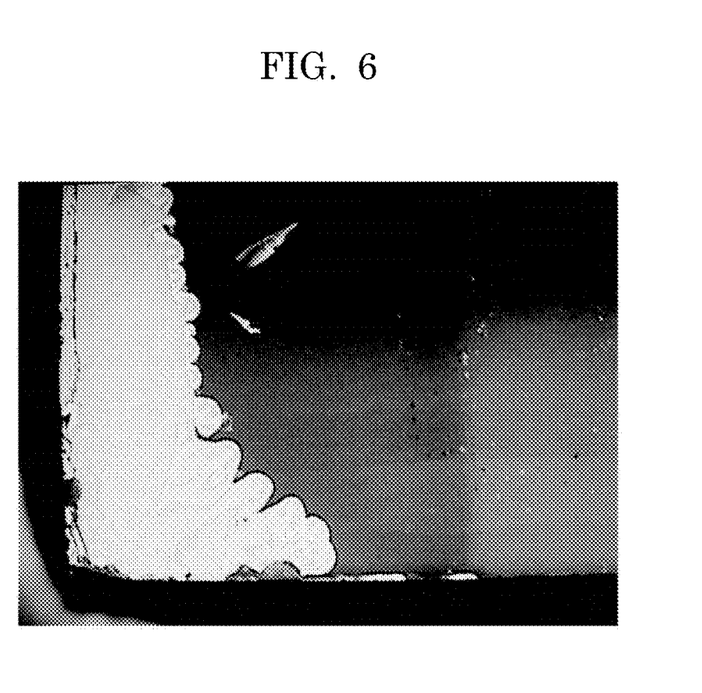
FIG. 6 is an image illustrating a surface where film flaking occurred after a high temperature and high humidity test in the inorganic wavelength plate of Comparative Example 1.
Figure 7A:
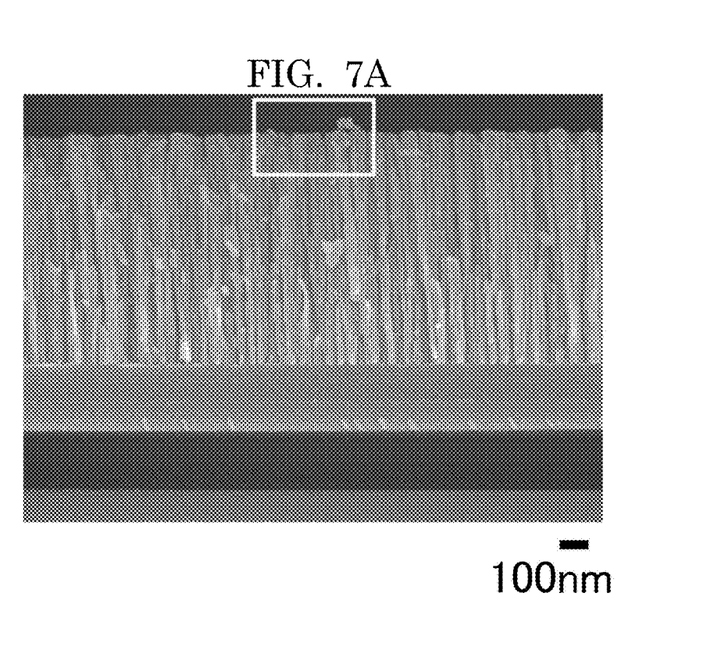
FIG. 7A is an SEM image illustrating a cross section of a portion where film flaking occurred after a high temperature and high humidity test in the inorganic wavelength plate of Comparative Example 1.
Figure 7B:
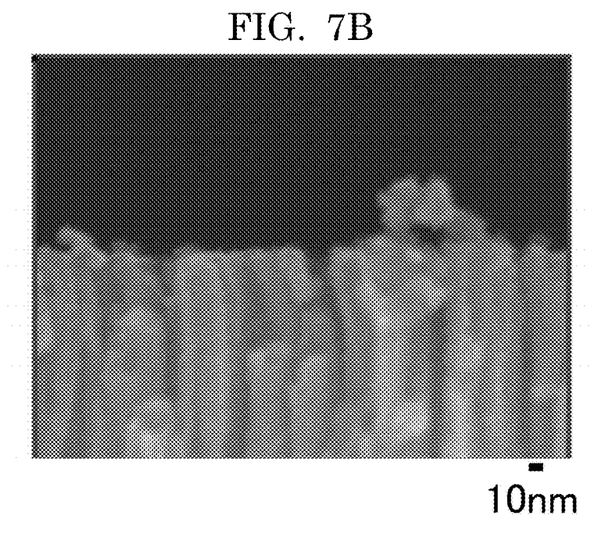
FIG. 7B is an enlarged SEM image of FIG. 7A.

FIG. 5 is an SEM image illustrating a cross section of the inorganic wavelength plate of Comparative Example 1. In FIG. 5, reference numeral 41 denotes a quartz substrate, reference numeral 42 denotes a matching film, reference numeral 43 denotes a birefringent film, reference numeral 44 denotes a CVD $SiO_2$ film, and reference numeral 45 denotes an AR film. FIG. 6 is an image illustrating a surface where film flaking occurred after the high temperature and high humidity test in the inorganic wavelength plate of Comparative Example 1. FIG. 7A is an SEM image illustrating a cross section of a portion where film flaking occurred after the high temperature and high humidity test in the inorganic wavelength plate of Comparative Example 1. FIG. 7B is an enlarged SEM image of an area surrounded by white lines in FIG. 7A. When the entry depth of $SiO_2$ into the void portion of the birefringent film was small as in Comparative Example 1, adhesion failed through the high temperature and high humidity test to thereby cause film flaking at the interface between the birefringent film and the protective film.

Figure 8:
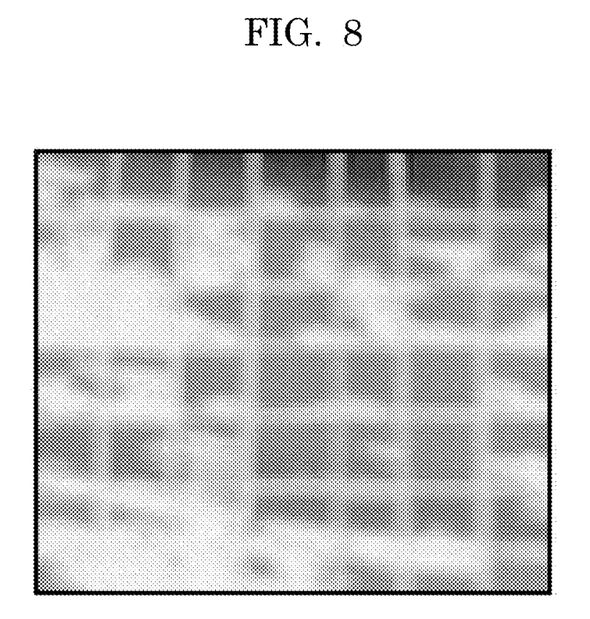
FIG. 8 is an image for evaluating a flaking level (JIS K 5600) of the inorganic wavelength plate of Example 1.

FIG. 8 is an image for evaluating a flaking level (JIS K 5600) of the inorganic wavelength plate of Example 1. When the entry depth of the component of the protective film was 3 nm as in Example 1, the film flaking was observed on a cross-cut area as illustrated in FIG. 8, but no film flaking was observed after the high temperature and high humidity test, which can be considered as practically available.

Figure 9A:
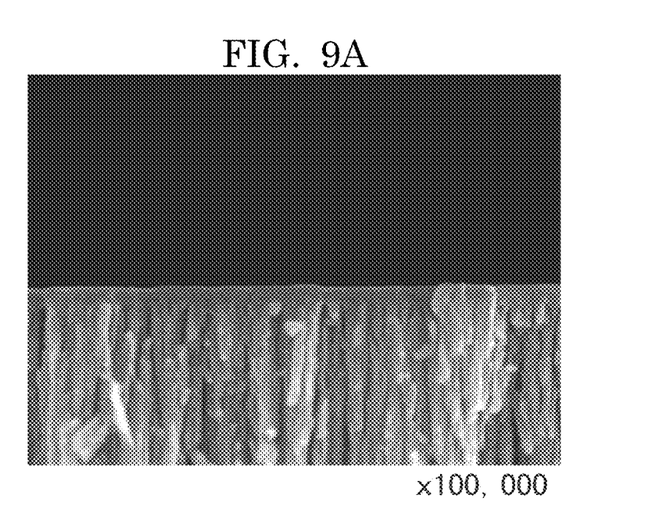
FIG. 9A is an SEM image illustrating a cross section of a sample of Example 4 on which a protective film has been formed.
Figure 9B:
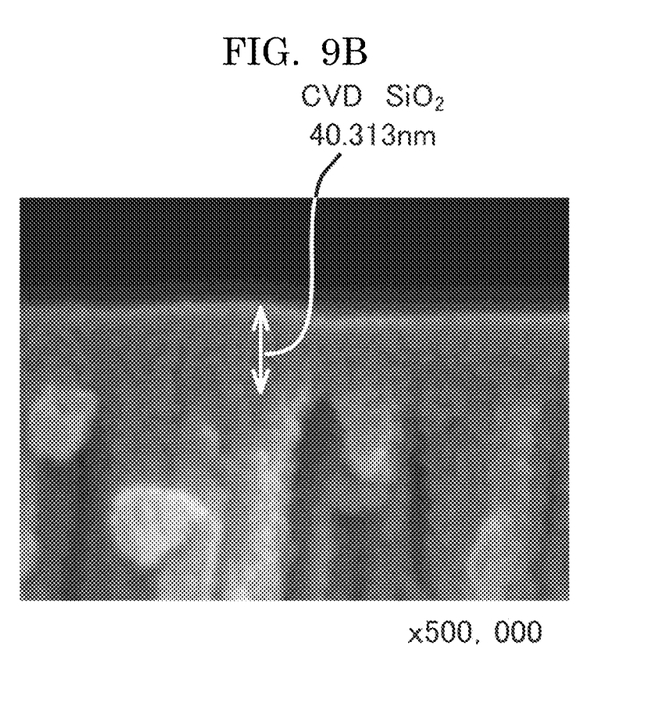
FIG. 9B is an enlarged SEM image of FIG. 9A.
Figure 10:
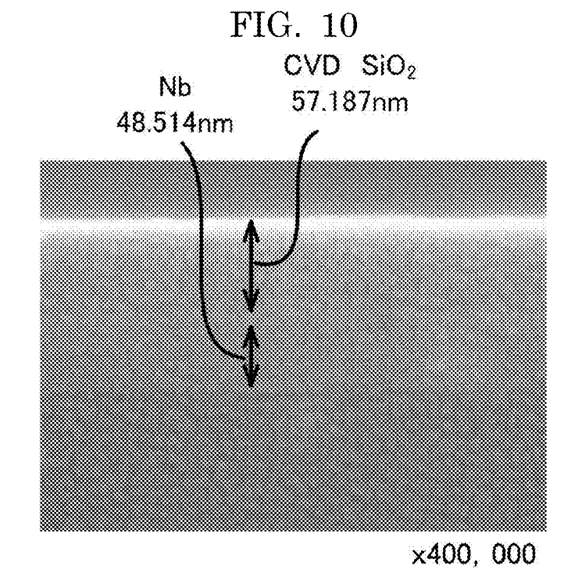
FIG. 10 is an SEM image illustrating a cross section of a sample which is formed by forming a protective film on a glass substrate simultaneous with formation of a protective film in the inorganic wavelength plate of Example 4.

FIG. 9A is an SEM image illustrating a cross section of a sample of Example 4 in which the protective film has been formed. FIG. 9B is an enlarged SEM image thereof. FIG. 10 is an SEM image illustrating a cross section of a sample which is formed by forming a protective film on a glass substrate simultaneous with formation of the protective film in the inorganic wavelength plate of Example 4. It can be seen from SEM images of FIGS. 9B and 10 that a $SiO_2$ film formed on the birefringent film having the columnar structure had a thickness of 40.313 nm, and that a $SiO_2$ film formed on the glass substrate had a thickness of 57.187 nm. Therefore, the $SiO_2$ film formed on the birefringent film having the columnar structure is believed to enter the void within the birefringent film and bind to the birefringent film. The entry depth of the component of the protective film into the birefringent film in Example 4 was determined as about 16 nm based on a difference between the thicknesses.

Figure 11:
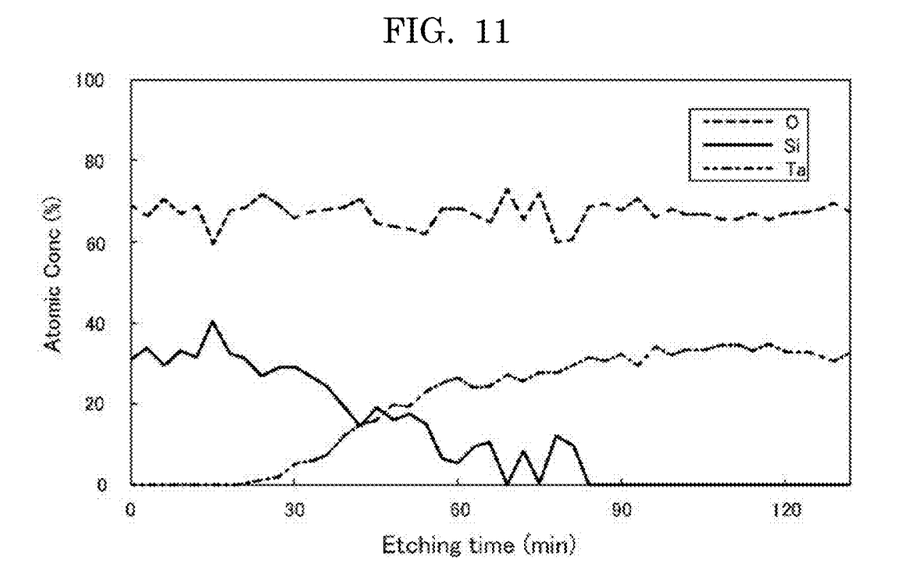
FIG. 11 is a graph illustrating an atomic concentration versus etching time (depth direction) of the inorganic wavelength plate of Example 4 in ESCA analysis.

FIG. 11 is a graph illustrating an atomic concentration versus etching time (depth direction) of the inorganic wavelength plate of Example 4 in ESCA analysis. As illustrated in FIG. 11, a layer from which both of $SiO_2$ and $Ta_2O_5$ were detected simultaneously was found.

Figure 12:
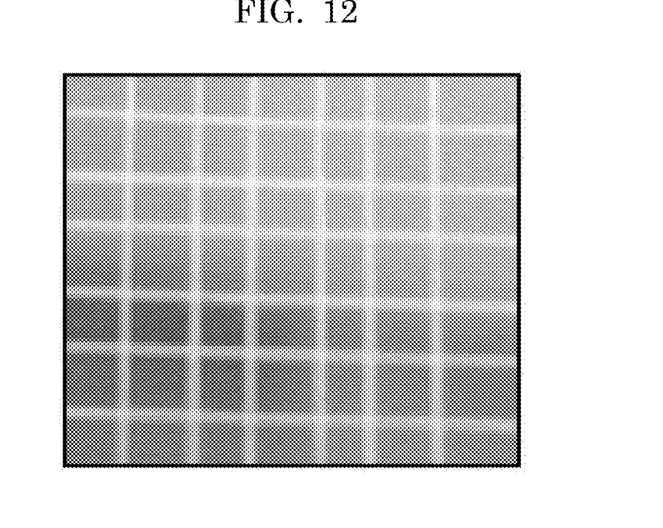
FIG. 12 is an image for evaluating a flaking level (JIS K 5600) of the inorganic wavelength plate of Example 4.

FIG. 12 is an image for evaluating a flaking level (JIS K 5600) of the inorganic wavelength plate of Example 4. When the entry depth of the component of the protective film was 16 nm as in Example 4, no film flaking was observed on the cross-cut area, indicating that high adhesion between the birefringent film and the protective film was achieved.

Figure 13:
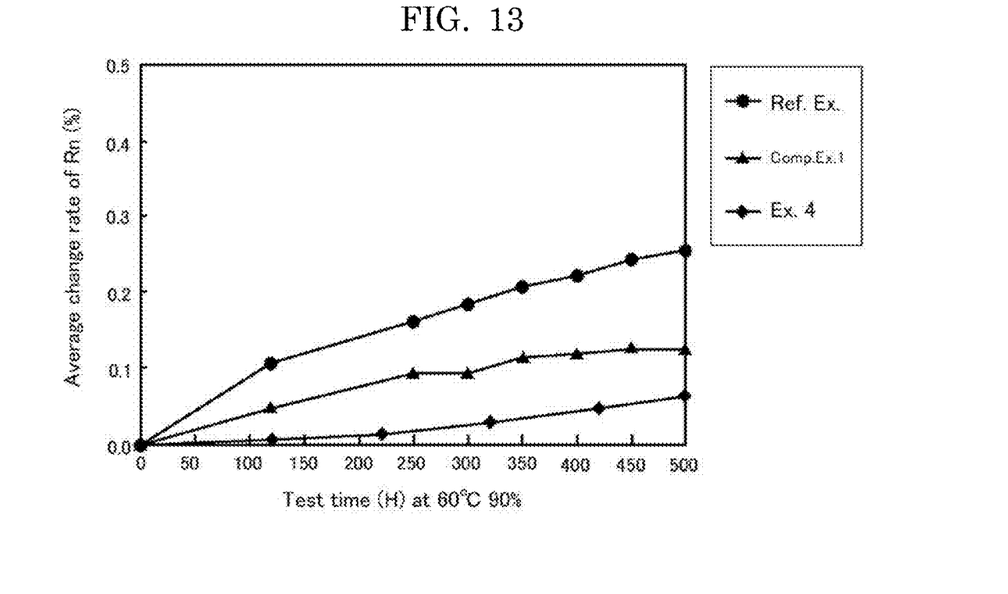
FIG. 13 is a graph illustrating a rate of change of reflectivity during a high temperature and high humidity test in the inorganic wavelength plates of Example 4 and Comparative Example 1.

FIG. 13 is a graph illustrating a rate of change of reflectivity during the high temperature and high humidity test in the inorganic wavelength plates of Example 4 and Comparative Example 1. In FIG. 13, a rate of change of reflectivity of a wavelength plate including an organic film is also presented as a reference example. The inorganic wavelength plate of Example 4 had high adhesion between the birefringent film and the protective film, so that the protective film was not flaked even after the high temperature and high humidity test. As a result, an amount of moisture contained in the void of the birefringent film was remained constant and the phase difference was able to be prevented from varying.

REFERENCE SIGNS LIST

11: base film
12: birefringent film
13: protective film
21: substrate
22: matching film
23: first AR film
24: birefringent film
25: protective film
26 second AR film
41: quartz substrate
42: matching film
43: birefringent film
44: CVD $SiO_2$ film
45: AR film

The invention claimed is:
1. An inorganic optical element, comprising:
a birefringent film having a columnar structure; and
a protective film formed on the birefringent film,
wherein a component of the protective film enters a gap in the columnar structure of the birefringent film, and wherein the inorganic optical element is consisting of inorganic materials.

2. The inorganic optical element according to claim 1, wherein an entry depth of the component of the protective film is 3 nm or more.

3. The inorganic optical element according to claim 1, wherein an entry depth of the component of the protective film is 10 nm or more.

4. The inorganic optical element according to claim 1, wherein the protective film is made of $SiO_2$.

5. The inorganic optical element according to claim 1, comprising:
 a glass substrate; and
 a matching film formed on the glass substrate,
 wherein the birefringent film is formed on the matching film.

6. A method for producing an inorganic optical element, the method comprising:
 forming a protective film on a birefringent film having a columnar structure to allow a component of the protective film to enter a gap in the columnar structure,
 wherein the inorganic optical element is consisting of inorganic materials.

7. The inorganic optical element according to claim 1, wherein the birefringent film comprises a columnar portion, a void portion which is air space between the columnar portions, and the component of the protective film.

\* \* \* \* \*